United States Patent [19]

Nanni et al.

[11] Patent Number: 4,998,077

[45] Date of Patent: Mar. 5, 1991

[54] VCO HAVING TAPERED OR STEPPED MICROSTRIP RESONATOR

[75] Inventors: Peter Nanni, Algonquin; Terry K. Mansfield, Palatine; Peter P. Walter, Schaumburg, all of Ill.

[73] Assignee: Motorola, Inc., Schaumburg, Ill.

[21] Appl. No.: 453,554

[22] Filed: Dec. 20, 1989

[51] Int. Cl.⁵ .............................................. H03B 5/18
[52] U.S. Cl. ............................... 331/99; 331/107 SL; 331/117 D; 333/219
[58] Field of Search ............... 331/96, 99, 107 SL, 331/117 D; 333/219, 238, 246, 247

[56] References Cited

U.S. PATENT DOCUMENTS 3,624,554 11/1971 Hilliker et al. ........................ 331/99

OTHER PUBLICATIONS

Chudobiak, "Microstrip TRAPATT Oscillator", Electronics Letters, vol. 6, No. 14, 9 Jul. 1970, pp. 438–439.

Primary Examiner—Siegfried H. Grimm
Attorney, Agent, or Firm—John W. Hayes

[57] ABSTRACT

A variable characteristic impedance microstrip resonator for use in a tunable oscillator circuit, the resonator having relatively high characteristic impedance near its driven end to maximize tuning range and relatively low characteristic impedance near its opposite end to minimize losses and thus optimize sideband noise performance.

3 Claims, 2 Drawing Sheets

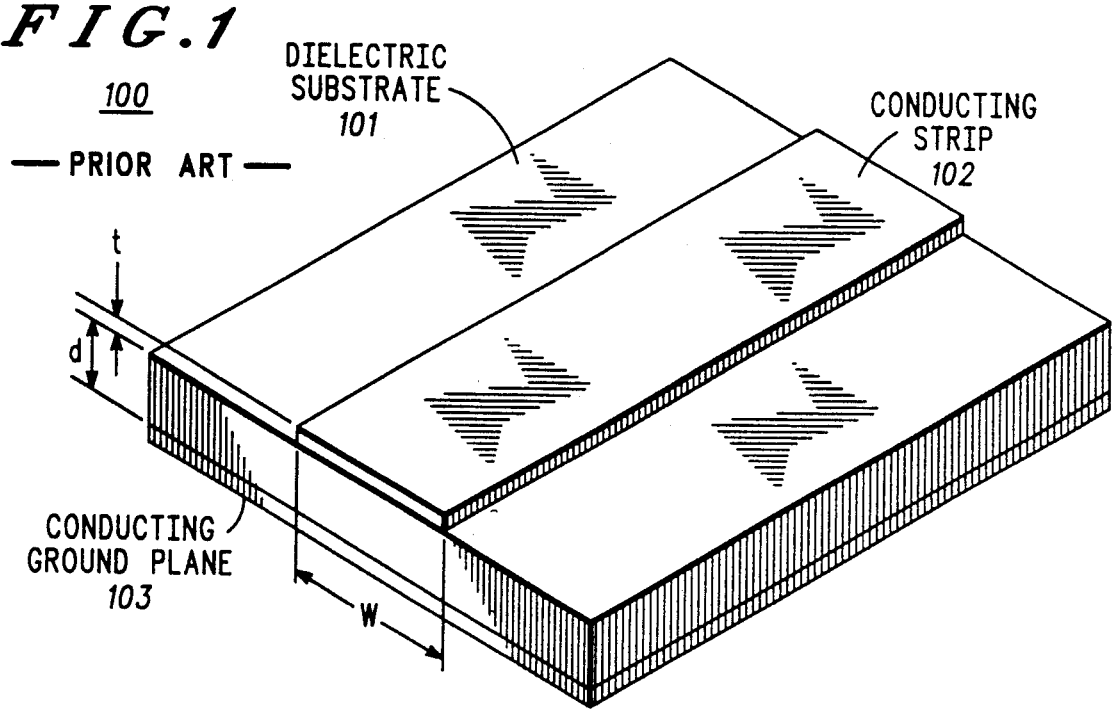
FIG.1 100 — PRIOR ART —
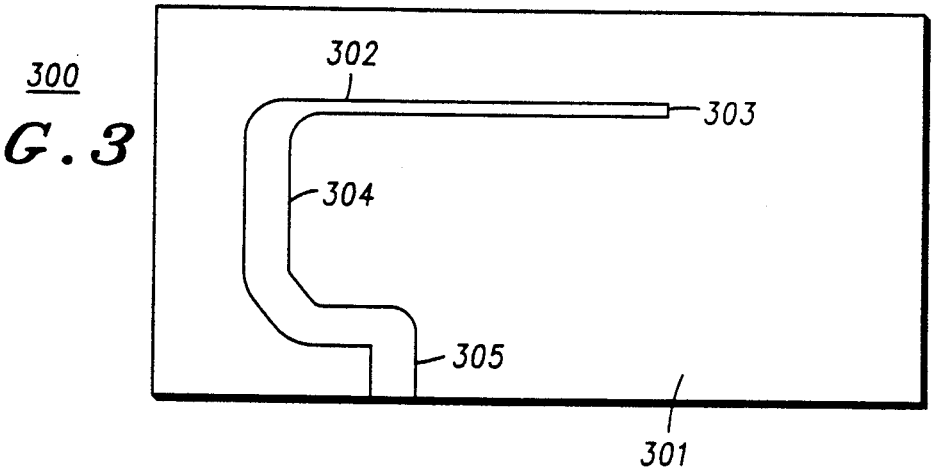
FIG.3
FIG.4A
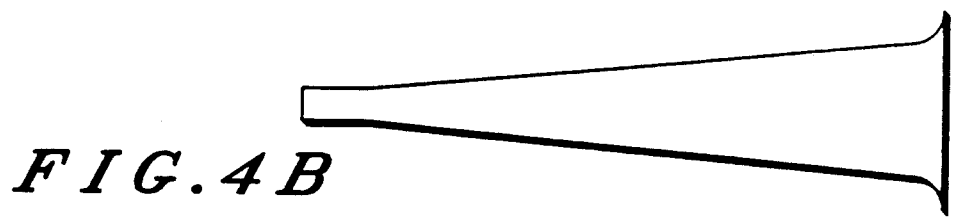
FIG.4B

VCO HAVING TAPERED OR STEPPED MICROSTRIP RESONATOR

TECHNICAL FIELD

This invention relates generally to VCOs (voltage controlled oscillators) and in particular to VCOs utilizing microstrip resonators, and is more particularly directed toward a method for improving VCO performance through the use of a microstrip resonator having variable characteristic impedance ($Z_0$).

BACKGROUND OF THE INVENTION

As is well known, an oscillator circuit generates an output signal at a frequency determined by a resonant network within a positive feedback path used to sustain oscillation. This resonant network is commonly a parallel LC (inductance-capacitance) circuit, or tank circuit, which can easily be realized through the use of discrete inductors and capacitors. An oscillator generally includes at least one active device to ensure the necessary gain for sustaining oscillation.

Oscillators employed in radio frequency (RF) communications equipment sometimes use quartz crystal resonators as feedback elements. Quartz crystals have very high Q (quality factor) near their resonant frequencies, and can be manufactured in such a way that they very accurately control the frequency of oscillation. In order to operate over a plurality of frequencies, a corresponding number of quartz crystals and associated switching components are required.

Modern RF communication units are generally digitally synthesized. As is well known in the art, a digital frequency synthesizer steers or tunes an oscillator over a range of frequencies, thus obviating the multiple crystal approach. Generally, the frequency synthesizer provides a control voltage that is directly proportional to the frequency of interest, and voltage variable capacitors (often varactor diodes) are used to transform this varying control voltage into a varying reactance that alters the resonant frequency of the oscillator's feedback network. An oscillator that is voltage-steered in this manner is known as a voltage controlled oscillator (VCO).

Crystal resonators are not suitable as resonant networks in VCOs, primarily because their high Q and narrow bandwidth make it difficult to adjust (warp) the crystal to a different frequency through the use of varactors. Discrete tank circuits, such as those described above, work much better in VCO applications. However, the parasitic capacitance associated with discrete inductors makes them virtually unusable as tank circuit components at high frequencies. Furthermore, particularly in the design of mobile and portable RF communication units, discrete components exhibit an undesirable microphonic effect. That is, the frequency of oscillation can change sharply as the result of vibration of discrete inductors employed in the tank circuit. In addition, modern manufacturing techniques dictate that the number of discrete components be minimized, since they lead to increased manufacturing cost and decreased reliability.

A viable solution to the problems inherent in discrete components is the use of a microstrip resonator. A microstrip resonator is a transmission line of predetermined electrical length constructed with microstrip techniques, coupled to the active device of the oscillator at one end, and connected to ground at the other.

Since transmission lines have distributed inductance and capacitance, a microstrip resonator will have a resonant frequency that is a function of these distributed parameters. The characteristic impedance of the transmission line resonator ($Z_0$) is also a function of these parameters.

Ideally, a microstrip resonator selected for use in a tunable oscillator, such as a VCO, will be low loss in order to achieve optimum sideband noise performance. Since conductor losses are much greater than dielectric losses, the transmission lines are typically made relatively wide to maximize conductor Q.

Distributed inductance of a microstrip transmission line is inversely proportional to conductor width, and, since characteristic impedance varies directly with distributed inductance, making the conductor relatively wide decreases $Z_0$ of the line. Optimum tuning bandwidth in microstrip resonator applications is obtained by using high $Z_0$ lines. This is a direct consequence of efforts to minimize parasitic capacitance of the resonator. The parasitic resonator capacitance appears in parallel with the varactor capacitance, reducing the overall change in varactor capacitance that can be induced by varying the control voltage. Making the transmission line resonator as thin as possible minimizes the line to ground plane capacitance, and, since $Z_0$ is inversely proportional to distributed capacitance, results in a transmission line resonator having a high characteristic impedance. Prior art implementations compromise performance by selecting a $Z_0$ which yields adequate Q and electronic bandwidth.

Accordingly, a need arises for a microstrip resonator structure which optimizes resonator Q for a given steering range requirement to yield good sideband noise performance while maintaining a wide bandwidth.

SUMMARY OF THE INVENTION

The above need is satisfied by a tunable oscillator circuit incorporating a microstrip resonator as a feedback element, wherein the microstrip resonator comprises a variable $Z_0$ resonator. The microstrip resonator may comprise a stepped transmission line, a continuously tapered transmission line, or another mechanism for varying the line $Z_0$.

BRIEF DESCRIPTION OF THE DRAWINGS

FIG. 1 is a perspective view of a microstrip transmission line resonator of the prior art;

FIG. 3 depicts the general shape of the preferred embodiment of the variable $Z_0$ resonator; and FIGS. 4A and 4B illustrate alternate embodiments of a variable $Z_0$ resonator.

DETAILED DESCRIPTION OF THE INVENTION

Figure 2:
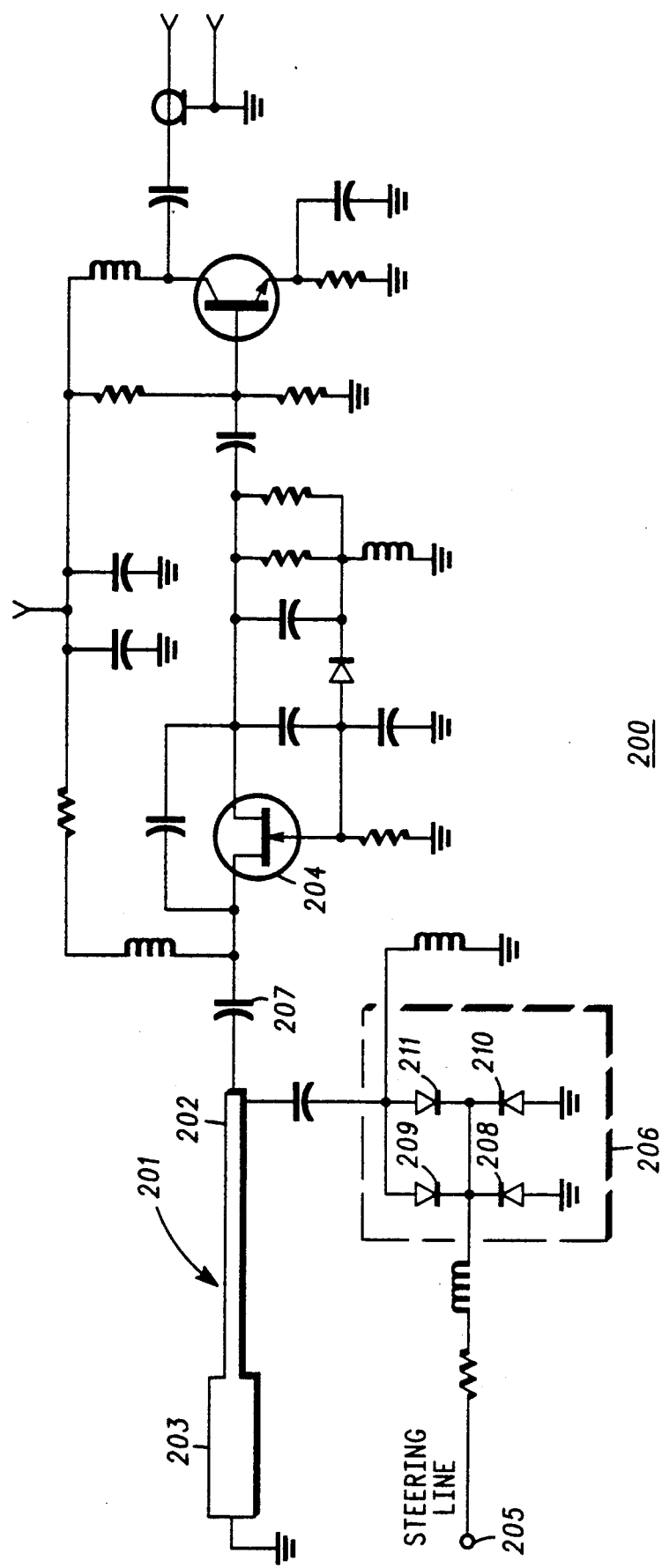
FIG. 2 is a schematic diagram of a portion of a voltage controlled oscillator incorporating the variable $Z_0$ resonator of the present invention.

FIG. 1 illustrates a typical microstrip transmission line, as generally depicted by the number 100, often used as a resonator in voltage controlled oscillators of the prior art. The microstrip resonator (100) is comprised of a relatively narrow conducting strip (102) separated from a conducting ground plane (103) by a dielectric substrate (101). In general, if the conducting strip (102) has a constant width (w) and a constant thickness (t), and the dielectric substrate material maintains the conducting strip (102) at a uniform distance (d)

from the conducting ground plane (103), the distributed inductance L of the line is given by:

$$L \approx \mu_0 \frac{d}{w}$$

where $\mu_0$ is the permeability of free space. Similarly, the distributed capacitance C is given by:

$$C \approx \epsilon_r \epsilon_0 \frac{w}{d}$$

where $\epsilon_0$ is the permittivity of free space and $\epsilon_r$ is the relative permittivity, or dielectric constant, of the dielectric material. The characteristic impedance ($Z_0$) is defined as:

$$Z_0 \approx \sqrt{\frac{L}{C}}$$

In microstrip transmission line resonators of the prior art, the width (w) of the conducting strip (102) is made relatively wide to minimize losses that adversely impact sideband noise performance of the VCO. But, since wider conducting strips have higher line to ground plane capacitance, prior art resonators tend to be relatively low impedance, which reduces VCO tuning bandwidth.

In accordance with the invention, a VCO incorporating a variable $Z_0$ resonator is illustrated in FIG. 2. The VCO, as generally depicted by the number 200, incorporated an N-channel JFET (junction field effect transistor) (204) as an active element. The JFET (204) is coupled to a first end (202) of a variable $Z_0$ resonator (201) through a coupling capacitor (207). The resonator (201) is relatively narrow at this first end (202) and is coupled to ground at a second end (203). A varactor diode array (206), comprising varactors 208 through 211, is used to tune the VCO. The capacitance of the varactor array (206) is varied by a control voltage produced by a digital frequency synthesizer (not shown) and applied over a steering line (205).

FIG. 3 depicts the general shape of the preferred embodiment of the variable $Z_0$ resonator, generally depicted by the number 300. The resonator comprises a conductive strip (302) separated from a conductive ground plane (not shown) by a dielectric material (301). The conductive strip (302) is relatively narrow near the end (303) coupled to the active element of the VCO. This relatively narrow section presents a relatively high characteristic impedance to the active device, so tuning bandwidth of the VCO is not compromised. Since most of the energy is contained in the electric field near the driven end of the line, making the conducting strip narrower does not significantly contribute to line losses. Thus, the Q of the line remains high, and no significant degradation of sideband noise performance results.

Away from the driven end (303), the resonator smoothly transitions into a wider region (304). In this region of the transmission line resonator, the energy is predominantly in the magnetic field, so the width of the conducting strip (302) is increased to minimize conductor losses that would degrade resonator Q and negatively impact sideband noise performance Of course, in addition to the structure discussed with reference to the preferred embodiment, other microstrip resonator structures could be used to realize similar performance improvements associated with variable $Z_0$ resonators. FIG. 4A illustrates a stepped transmission line geometry, while FIG. 4B shows a variable $Z_0$ resonator realized through a continuous taper approach.

What is claimed is:

1. In a tunable oscillator circuit incorporating a microstrip resonator as a feedback element, wherein the microstrip resonator is coupled to an active device at a first end and coupled to ground at a second end, an improvement wherein the microstrip resonator comprises:

a resonator constructed and arranged to exhibit a characteristic impedance ($Z_0$) which varies along its length, having a relatively high $Z_0$ near said first end to maximize tuning range, and a relatively low $Z_0$ near said second end to minimize losses.

2. The tunable oscillator circuit in accordance with claim 1, wherein the resonator is a stepped microstrip transmission line resonator.

3. The tunable oscillator circuit in accordance with claim 1, wherein the resonator is a continuously tapered microstrip transmission line resonator.

* * * * *